United States Patent
Lee et al.

(10) Patent No.: US 7,989,296 B2
(45) Date of Patent: Aug. 2, 2011

(54) SEMICONDUCTOR DEVICE AND METHOD OF MANUFACTURING SAME

(75) Inventors: Sung-young Lee, Suwon-si (KR); Dong-suk Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 750 days.

(21) Appl. No.: 12/015,646

(22) Filed: Jan. 17, 2008

(65) Prior Publication Data
US 2008/0132011 A1  Jun. 5, 2008

Related U.S. Application Data

(60) Provisional application No. 11/081,538, filed on Mar. 17, 2005, now abandoned.

(30) Foreign Application Priority Data

Jun. 28, 2004  (KR) .................. 10-2004-0049004

(51) Int. Cl.
*H01L 21/336* (2006.01)
(52) U.S. Cl. ............ 438/300; 257/E21.43; 257/E21.431
(58) Field of Classification Search .................. 257/349, 257/E21.179, E21.646, E21.43, E21.431, 257/E21.562, E21.571, E29.193; 438/241, 258, 300, 429, 282
See application file for complete search history.

(56) References Cited

U.S. PATENT DOCUMENTS

| 5,240,876 | A | 8/1993 | Gaul et al. |
| 6,570,217 | B1 * | 5/2003 | Sato et al. ................. 257/327 |
| 7,019,364 | B1 | 3/2006 | Sato et al. |
| 7,033,868 | B2 | 4/2006 | Nakamura et al. |
| 7,605,025 | B2 * | 10/2009 | Kim et al. ................. 438/151 |
| 7,605,443 | B2 * | 10/2009 | Ogura ....................... 257/522 |
| 2002/0149031 | A1 | 10/2002 | Kim et al. |
| 2003/0155572 | A1 | 8/2003 | Han et al. |

FOREIGN PATENT DOCUMENTS

| JP | 2002009291 | 1/2002 |
| JP | 2003298047 | 10/2003 |

* cited by examiner

*Primary Examiner* — David Vu
(74) *Attorney, Agent, or Firm* — Volentine & Whitt, PLLC

(57) ABSTRACT

A semiconductor device and related method of manufacture are disclosed. The semiconductor device comprises a gate electrode formed on a semiconductor substrate, an active region containing spaces formed below the gate electrode, a channel region formed between the gate electrode and the spaces, and source and drain regions formed on opposite sides of the gate electrode within the active region. The spaces are formed by etching a semiconductor layer formed below the gate electrode in the active region.

12 Claims, 15 Drawing Sheets

SEMICONDUCTOR DEVICE AND METHOD OF MANUFACTURING SAME

CROSS-REFERENCE TO RELATED APPLICATION

This is a divisional of application Ser. No. 11/081,538, filed Mar. 17, 2005, which is incorporated herein by reference in its entirety.

BACKGROUND OF THE INVENTION

1. Field of the Invention

The present invention relates generally to a semiconductor device and a method of manufacturing the same. More particularly, the invention relates to a semiconductor device comprising a metal oxide semiconductor (MOS) transistor and a method of manufacturing the same.

2. Description of the Related Art

Fully depleted silicon-on-insulator (FD-SOI) technology has been widely used to create high speed, low power logic circuits. Using FD-SOI technology reduces parasitic capacitances associated with source, drain, and channel regions of semiconductor circuits, thereby allowing the circuits to operate at higher speeds. In addition, FD-SOI technology reduces the amount of leakage current occurring at source and drain junctions of the circuits, thereby lowering associated power consumption. Furthermore, shallow source/drain regions are readily implemented using FD-SOI technology, thus allowing the short channel effect to be readily constrained and thereby improving the scalability of the circuits.

Unfortunately, however, a substrate floating effect may occur in MOS transistors formed on an SOI substrate where an element in a channel region assumes a floating state electric potential. Furthermore, where a buried oxide layer (BOX) is formed below a silicon substrate, a self-heating problem often occurs in devices formed on the silicon layer. As a result, the range of applications where SOI technology can be used is restricted by the kinds of circuits to be formed.

As complementary metal-oxide semiconductor (CMOS) technology has continued to shrink in size, a variety of attempts to improve the performance of transistors with short channel lengths have been made. Among these attempts, a mechanical stress engineering technique has been proposed. According to the mechanical stress engineering technique, a local stress is applied to a channel region so as to control the carrier (electron or hole) mobility ($\mu$) within a semiconductor material. Where the carrier mobility increases, the switching characteristics of the device are improved, thus enabling the manufacture of higher-speed devices.

Unfortunately, it is difficult to apply local stress to SOI devices because the silicon layer formed on the buried oxide layer (BOX) is too thin. In addition, cost poses an obstacle to the manufacture of devices using SOI technology because SOI wafers are extremely expensive.

SUMMARY OF THE INVENTION

The present invention provides a semiconductor device capable of improving carrier mobility by applying a local stress to a channel region while maintaining advantages of an SOI device, such as the ability to constrain short channel effects and reduce junction resistance.

In addition, the present invention provides a method of manufacturing a semiconductor device in which a highly integrated semiconductor device having an improved short channel effect and reduced junction capacitance, as well as a device being capable of constraining a substrate floating effect may be implemented at a relatively low cost.

According to one embodiment of the present invention, a semiconductor device is provided. The semiconductor device comprises a gate electrode formed on a semiconductor substrate, an active region containing spaces formed below the gate electrode, a channel region formed between the gate electrode and the spaces, and source and drain regions formed on both sides of the gate electrode within the active region.

According to another embodiment of the present invention, a method of manufacturing a semiconductor device is provided. The method comprises forming a gate electrode on a semiconductor substrate, forming spaces in an active region below the gate electrode, forming a channel region between the gate electrode and the spaces, and forming source and gate regions on both sides of the gate electrode within the active region.

According to the present invention, the short channel effect is constrained and junction resistance is reduced by forming the spaces in the active region below the gate electrode. Furthermore, it effectively addresses the substrate floating effect which occurs in devices using SOI technology. Furthermore, the invention makes it possible to implement the mechanical stress engineering technique to the channel region to increase carrier mobility.

BRIEF DESCRIPTION OF THE DRAWINGS

The invention is described below in relation to several embodiments illustrated in the accompanying drawings. Throughout the drawings like reference numbers indicate like exemplary elements, components, or steps and the thickness of various layers has been exaggerated for clarity. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

FIGS. 1A through 1M are cross-sectional views illustrating a method of manufacturing a semiconductor device according to one embodiment of the present invention.

Figure 1A:
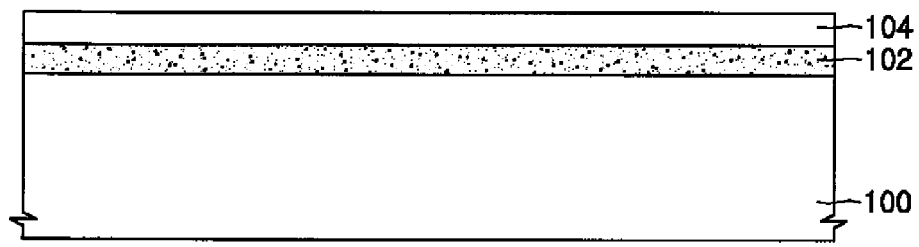
FIGS. 1A through 1M are cross-sectional views illustrating a method of manufacturing a semiconductor device according to one embodiment of the present invention.

Referring to FIG. 1A, a first silicon germanium (SiGe) layer 102 is formed on a bulk semiconductor substrate 100 such as a silicon substrate. First SiGe layer 102 is generally formed to a thickness of about 10 to 100 nm using a selective epitaxial growth technology. A silicon (Si) layer 104 is then formed on first SiGe layer 102 to a thickness of about 5 to 50 nm.

Figure 1B:
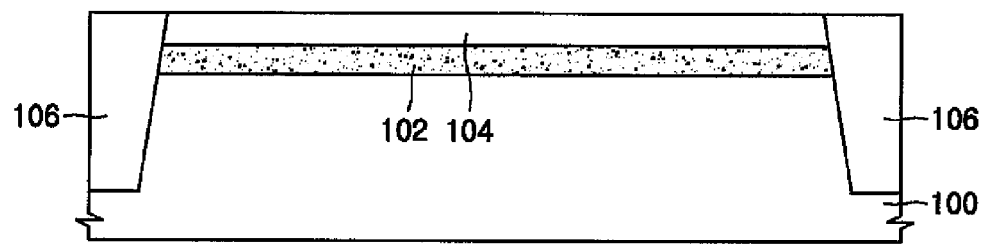

Referring to FIG. 1B, an active region is defined by forming a device isolation region 106 on semiconductor substrate 100 using a conventional isolation method such as a trench isolation method. In other words, the active region is delimited on either side by device isolation region 106.

Figure 1C:
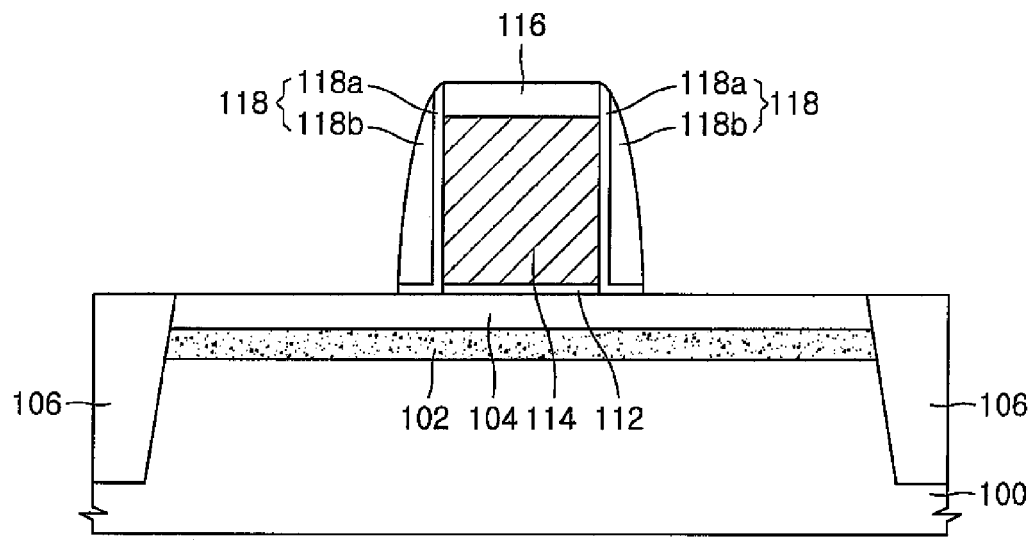

Referring to FIG. 1C, a gate insulating layer 112 and a gate electrode 114 are formed on Si layer 104 using a hard mask 116 formed of an insulating material. First insulating spacers 118 are formed on sidewalls of gate electrode 114. According to selected embodiments of the invention, first insulating spacers 118 comprise a silicon nitride layer 118a, a silicon oxide layer 118b, or a combination thereof.

Figure 1D:
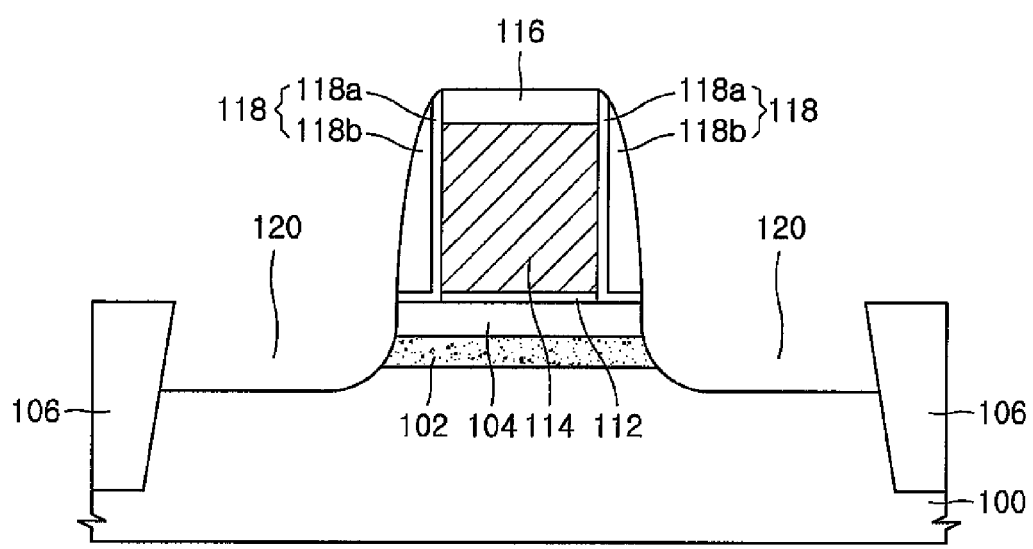

Referring to FIG. 1D, an Si layer 104, first SiGe layer 102 and semiconductor substrate 100 are partially etched to form a recess region 120 using hard mask 116, first insulating spacers 118 and device isolation region 106 as an etching mask. In recess region 120, sidewalls of first SiGe layer 102, sidewalls of Si layer 104, and sidewalls of device isolation region 106 are exposed. A portion of Si layer 104 remaining below gate electrode 114 acts as a channel region for a transistor.

Figure 1E:
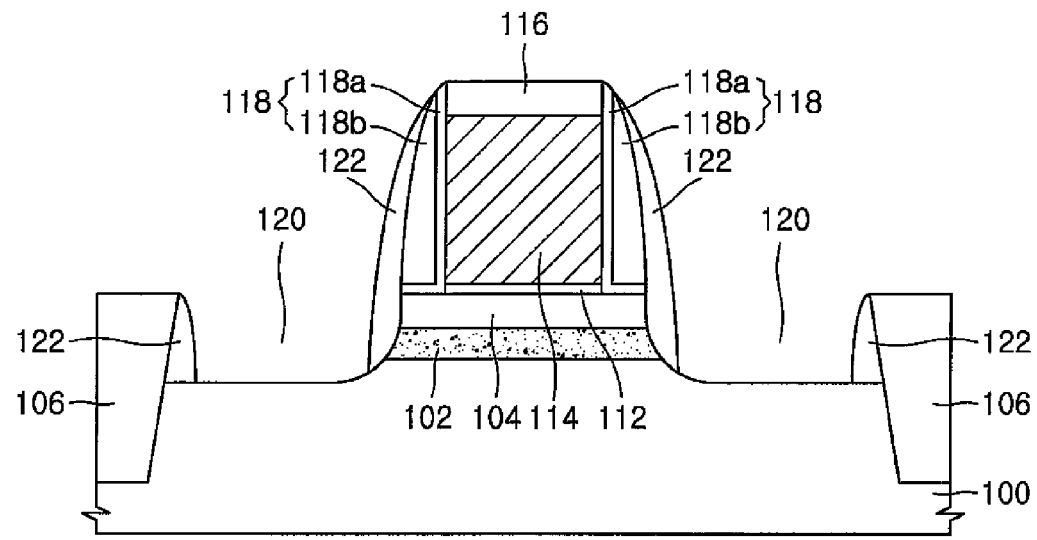

Referring to FIG. 1E, an insulating material is deposited on the structure having recess region 120 and an etch-back process is performed to form second insulating spacers 122 covering sidewalls of first SiGe layer 102, sidewalls of Si layer 104 and sidewalls of first insulating spacers 118, which are exposed in or above recess region 120. Second insulating spacers 122 are also formed on sidewalls of device isolation region 106. According to selected embodiments of the invention, second insulating spacers 122 are formed of a silicon oxide layer, a silicon nitride layer, or a combination thereof. Preferably, second insulating spacers 122 are formed of a silicon oxide layer.

Figure 1F:
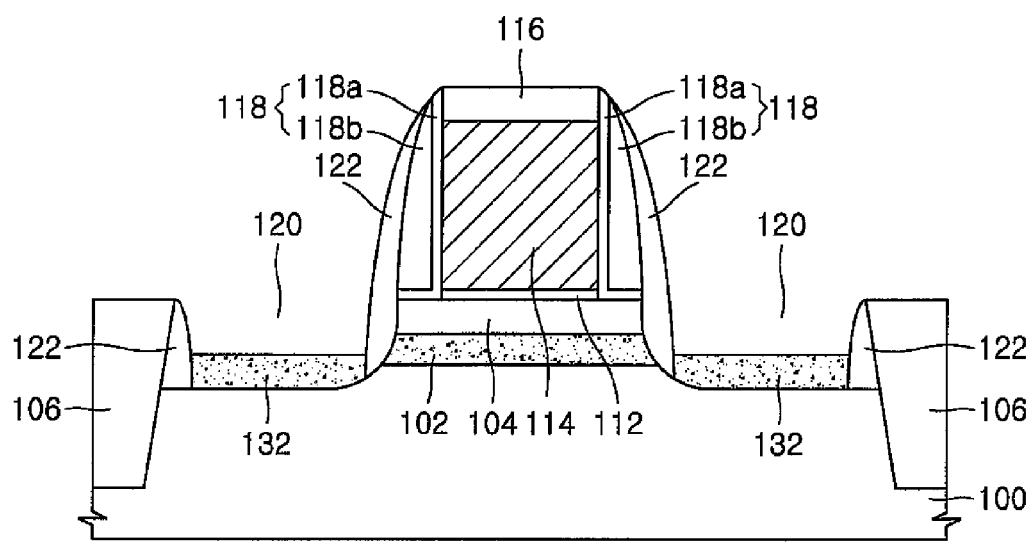

Referring to FIG. 1F, a second SiGe layer 132 is formed on semiconductor substrate 100 in recess region 120. Second SiGe layer 132 is formed to a thickness of about 10 to 100 nm using a selective epitaxial growth technology. Preferably, second SiGe layer 132 has the same thickness as first SiGe layer 102. Also, preferably, a Ge concentration in second SiGe layer 132 is equal to a Ge concentration in first SiGe layer 102.

Figure 1G:
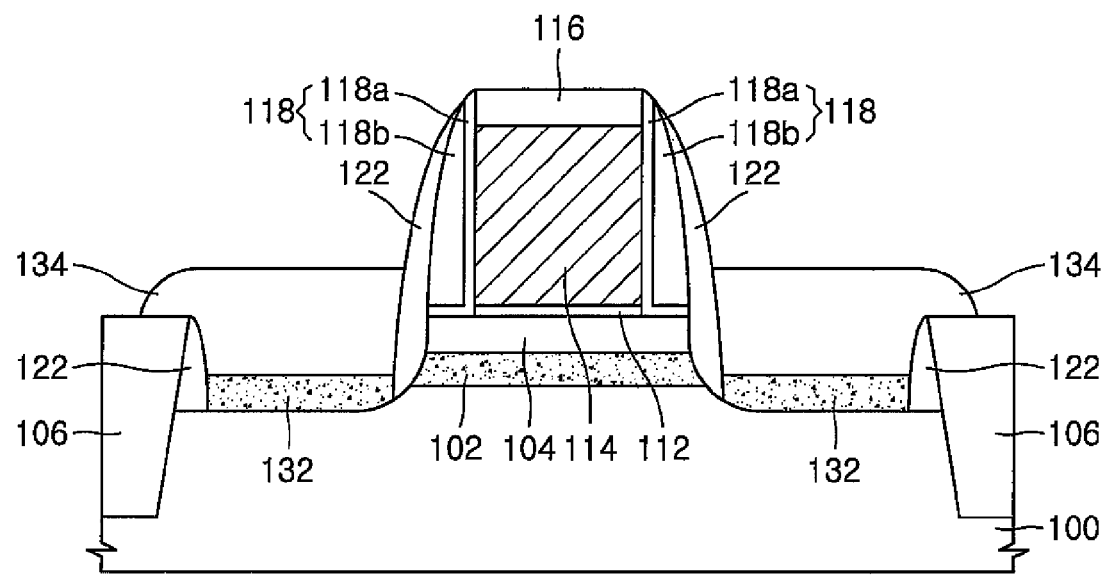

Referring to FIG. 1G, a semiconductor layer 134 is formed on second SiGe layer 132 using a selective epitaxial growth technology. Semiconductor layer 134 is formed of a different material from second SiGe layer 132. For example, semiconductor layer 134 may be formed of Si or SiC. Where semiconductor layer 134 is formed of SiC, the carrier mobility in an negative metal-oxide semiconductor (NMOS) device can be improved by locally applying a tensile stress to the channel region formed by Si layer 104.

Semiconductor layer 134 is formed to a thickness sufficient to completely fill recess region 120. As shown in FIG. 1G, semiconductor layer 134 typically has a thickness such that semiconductor layer 134 partially covers an upper surface of device isolation region 106. As a result, semiconductor layer 134 generally protects a corner portion of device isolation region 106.

Figure 1H:
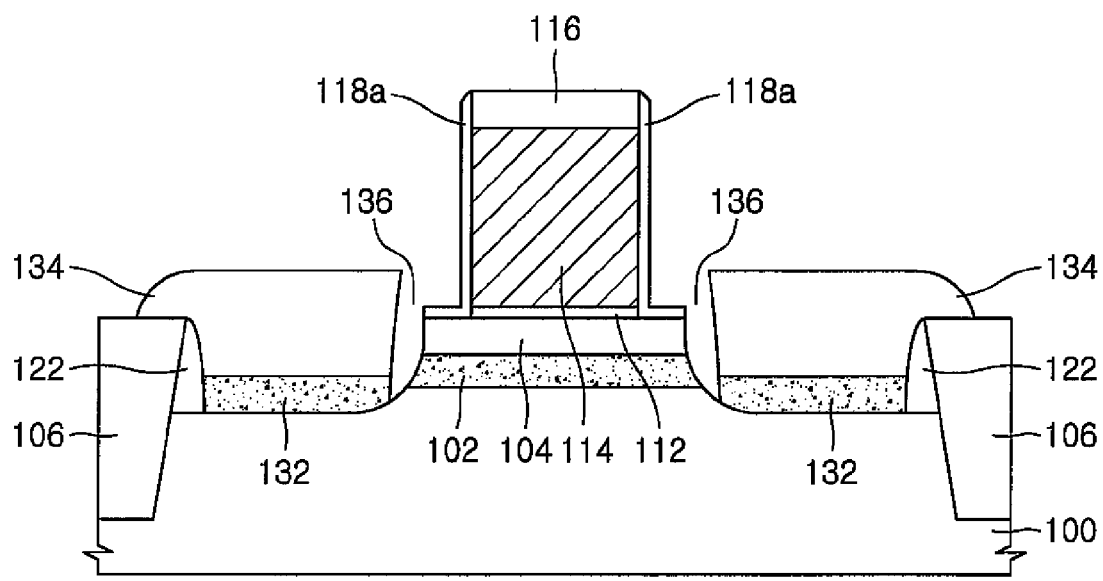

Referring to FIG. 1H, second insulating spacers 122 etched and thereby removed. Consequently, the sidewalls of first and second SiGe layers 102 and 132 are exposed through spaces 136 between Si layer 104 and semiconductor layer 134.

Figure 1I:
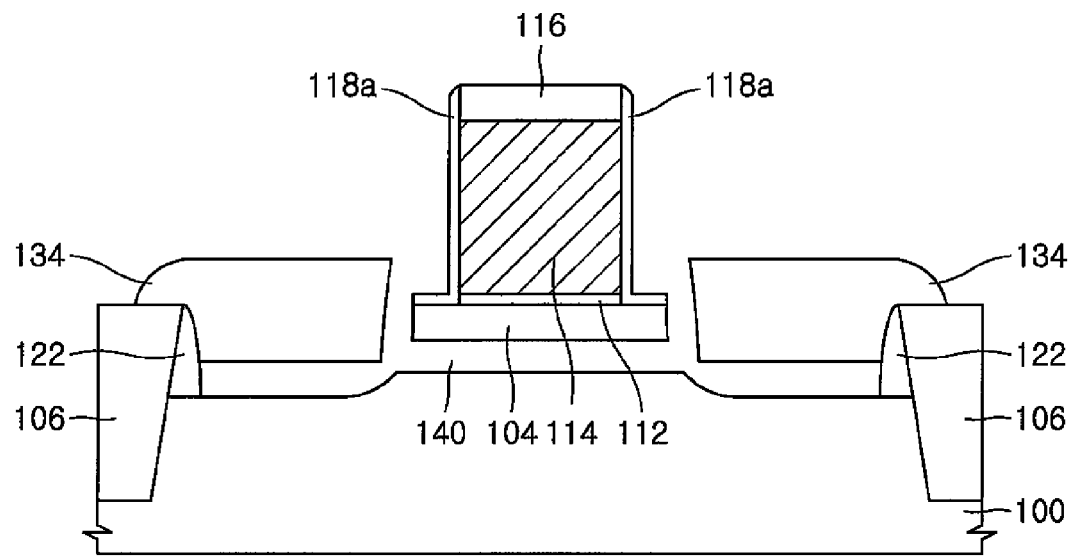

Referring to FIG. 1I, first and second SiGe layers 102 and 132 are selectively removed to form spaces 140 below Si layer 104 and semiconductor layer 134, respectively. First and second SiGe layers 102 and 132 are generally removed using a wet etching process or an isotropic plasma etching process. The plasma etching process may employ, for example, an etchant comprised of a mixture of $HNO_3$, $H_2O_2$, and HF.

Figure 1J:
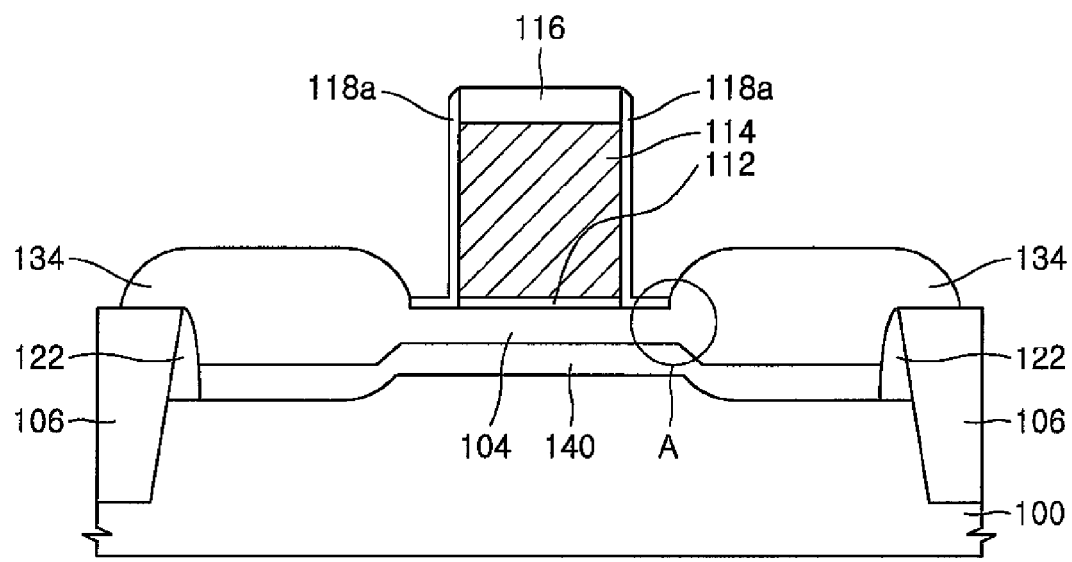

Referring to FIG. 1J, Si is epitaxially grown from Si layer 104 and semiconductor layer 134 using a selective epitaxial growth technology. As a result, Si layer 104 and semiconductor layer 134 are joined together by a region "A".

Figure 1K:
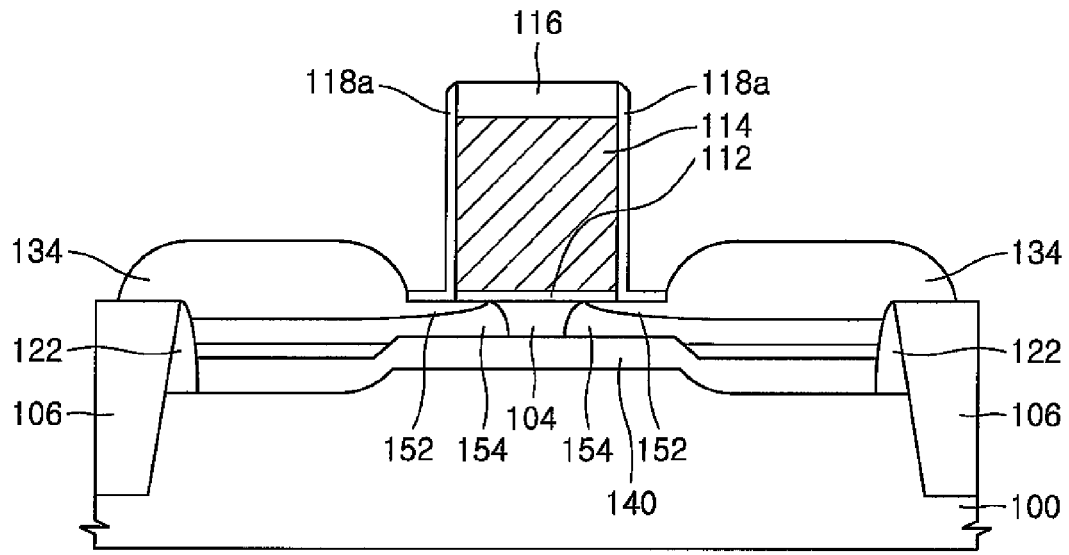

Referring to FIG. 1K, an extension region 152 and a halo ion implantation region 154 are formed in semiconductor layer 134 and Si layer 104 using a conventional ion implantation process using hard mask 116 as an ion implantation mask.

Figure 1L:
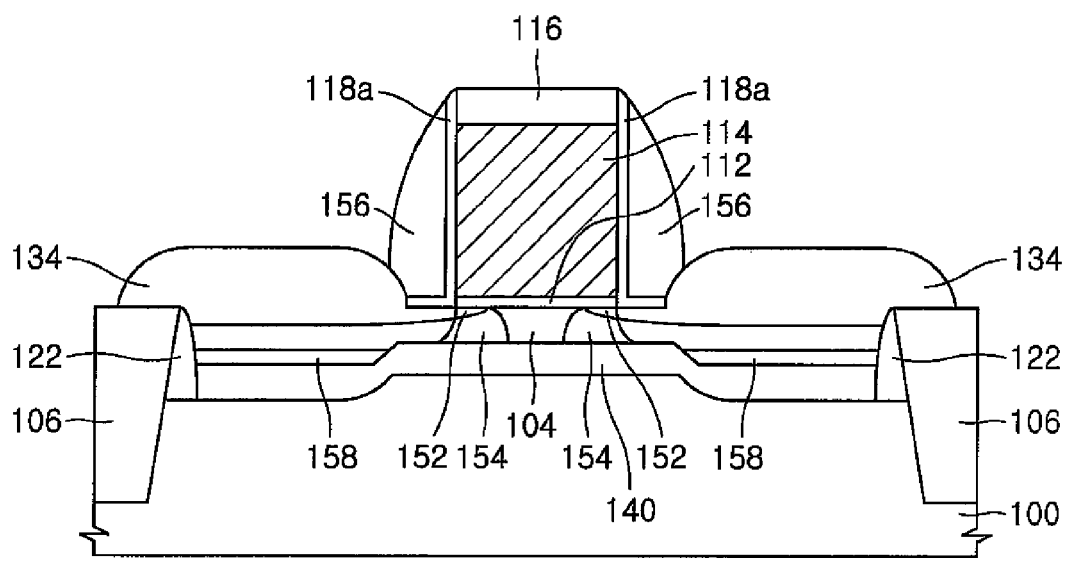

Referring to FIG. 1L, third insulating spacers 156 covering silicon oxide layer 118b are formed on the sidewalls of gate electrode 114. Third insulating spacers 156 are usually formed of either a silicon oxide layer, a silicon nitride layer, or a combination thereof. Preferably, third insulating spacers 156 are formed of a silicon oxide layer.

Source and drain regions 158 are then formed in semiconductor layer 134 and Si layer 104. Source and drain regions 158 are typically formed using a conventional ion implantation process using hard mask 116 and third insulating spacers 156 as an ion implantation mask.

Figure 1M:
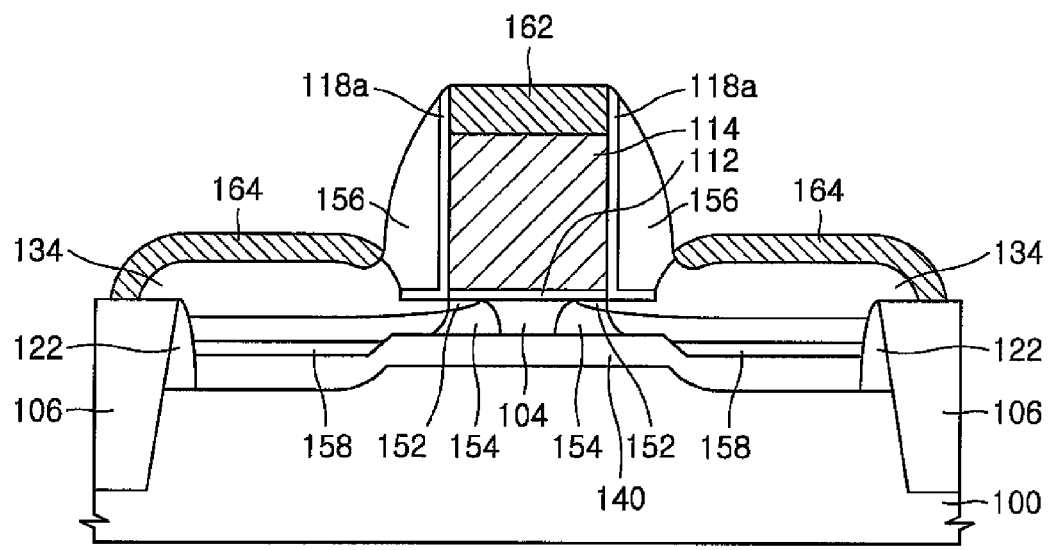

Referring to FIG. 1M, hard mask 116 is removed from gate electrode 114 and then metal silicide layers 162 and 164 are formed on upper surfaces of gate electrode 114 and source and drain regions 158 using a conventional silicide deposition process. Metal silicide layers 162 and 164 contribute to reduced surface resistance and contact resistance for contacts in the semiconductor device. Metal silicide layers 162 and 164 are typically formed of cobalt silicide, nickel silicide, titanium silicide, hafnium silicide, platinum silicide, or tungsten silicide. In some instances, the formation of metal silicide layers 162 and 164 can be omitted.

According to selected embodiments of the present invention, spaces 140 are extended to completely overlap the channel region and source and drain regions 158. Accordingly, as in the case where a SOI substrate is used, the short channel effect is readily constrained and junction capacitance is reduced.

Figure 2A:
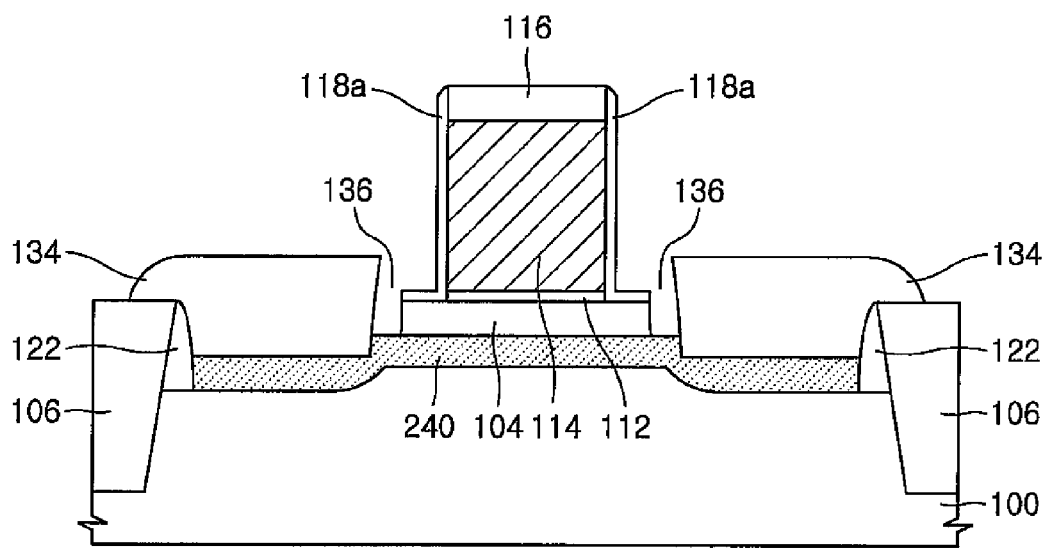
FIGS. 2A through 2C are cross-sectional views illustrating a method of manufacturing a semiconductor device according to another embodiment of the present invention.
Figure 2B:
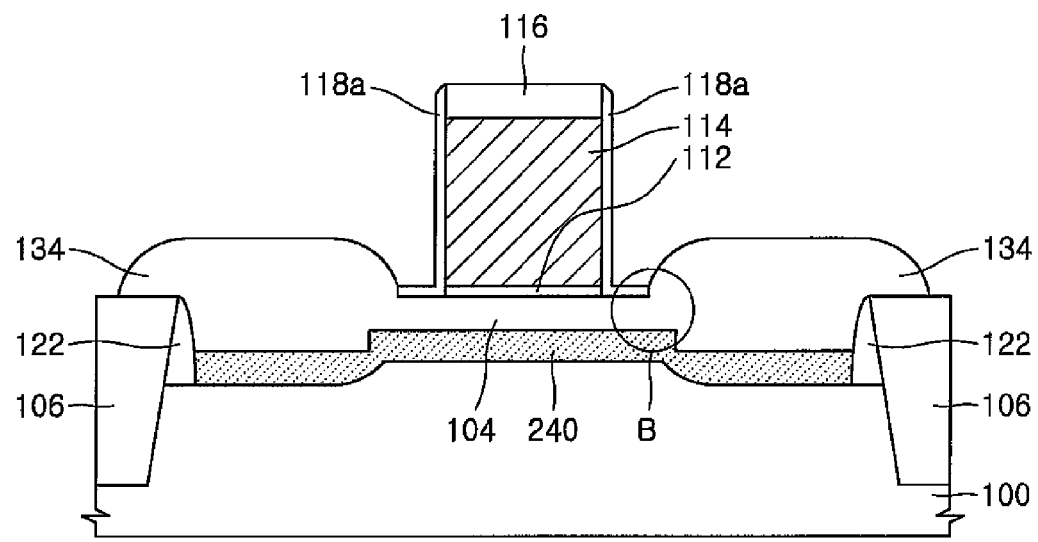
Figure 2C:
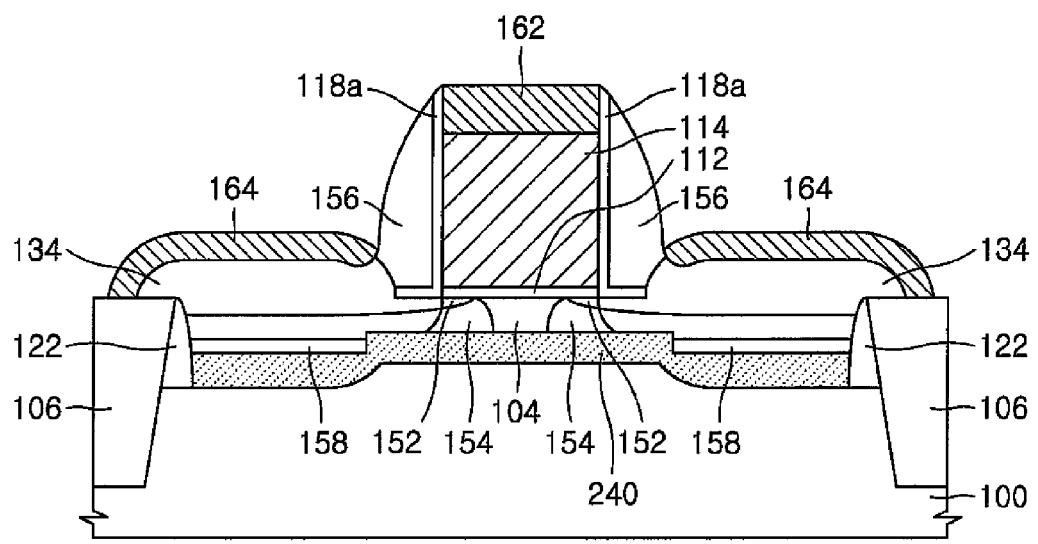

FIGS. 2A through 2C are cross-sectional views illustrating a method of manufacturing a semiconductor device according to another embodiment of the present invention.

The embodiment illustrated in FIGS. 2A through 2C is substantially similar to the embodiment illustrated in FIGS. 1A through 1M. One difference, however, is that spaces 140 formed in the active region below gate electrode 114 are filled with insulating materials.

Referring to FIG. 2A, spaces 140 are formed in an active region of a semiconductor substrate 100 in the manner described in relation to FIGS. 1A through 1I. An insulating material is deposited to fill spaces 140 and an etch-back process is performed to expose sidewalls of Si layer 104. Consequently, spaces 140 are filled by an insulating layer 240. Insulating layer 240 is typically formed of an oxide layer or a nitride layer.

Referring to FIG. 2B, Si is epitaxially grown from Si layer 104 and semiconductor layer 134 in the manner described in relation to FIG. 1J, thereby joining Si layer 104 and semiconductor layer 134 with a region "B".

Referring to FIG. 2C, a transistor is formed in the manner described in relation to FIGS. 1K through 1M.

According to selected embodiments of the present invention, insulating layer 240 is extended to completely overlap the channel region and source and drain regions 158. Accordingly, as in the case where a SOI substrate is used, the short channel effect is readily constrained and junction capacitance is reduced.

Figure 3A:
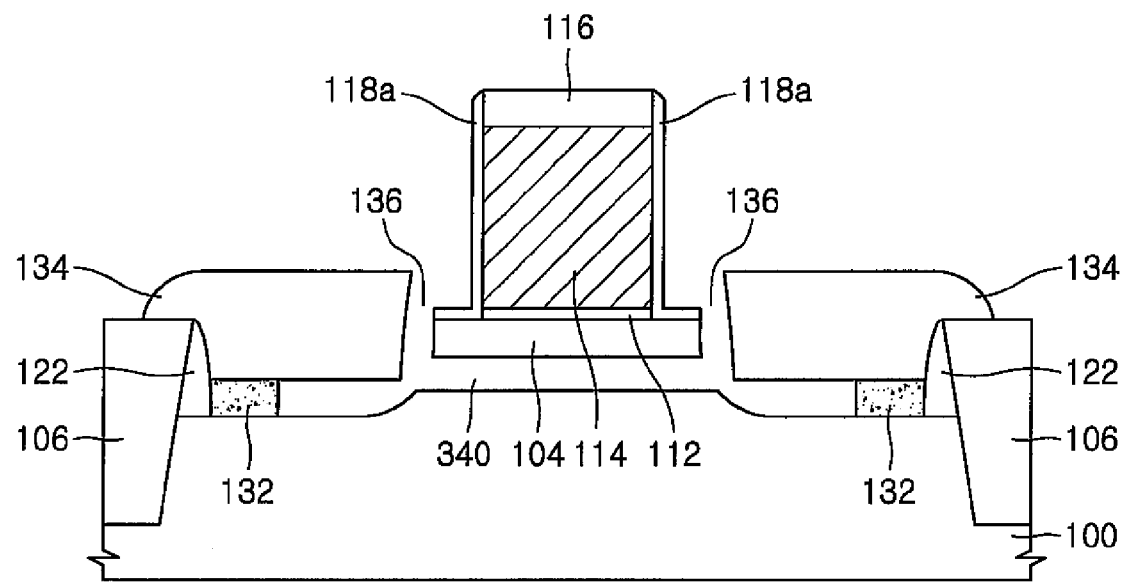
FIGS. 3A through 3C are cross-sectional views illustrating a method of manufacturing a semiconductor device according to still another embodiment of the present invention.
Figure 3B:
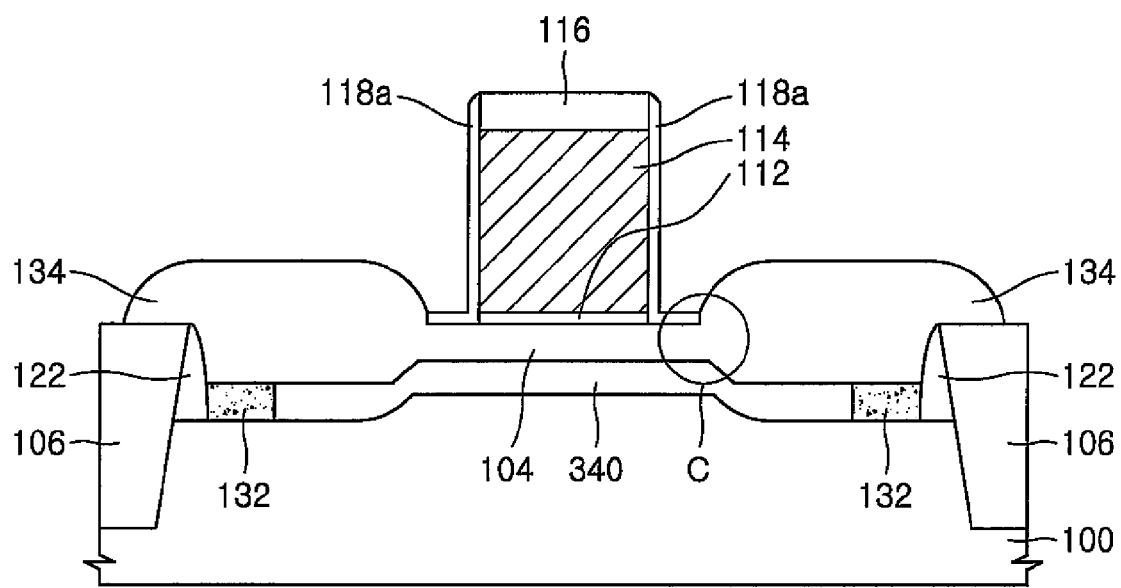
Figure 3C:
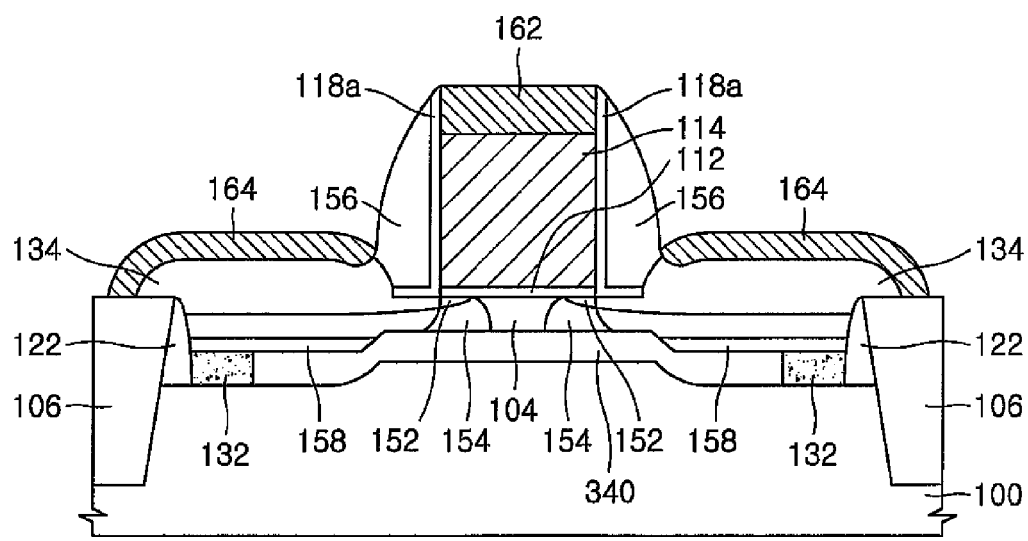

FIGS. 3A through 3C are cross-sectional views illustrating a method of fabricating a semiconductor device according to still another embodiment of the present invention.

The method illustrated in FIGS. 3A through 3C is substantially similar to the method illustrated in FIGS. 1A through 1M. One difference, however, is that the spaces formed on the active region below gate electrode 114 are extended to only a portion of the active region.

Referring to FIG. 3A, spaces 136 exposing the sidewalls of first and second SiGe layers 102 and 132 are formed on semiconductor substrate 100 in the manner described in relation to FIGS. 1A through 1H. First and second SiGe layers 102 and 132 exposed through spaces 136 are partially removed to form spaces 340 below Si layer 104 and semiconductor layer 134. Portions of second SiGe layer 132 adjacent to second insulating spacers 122 are prevented from being removed by controlling the amount of time used to etch first and second SiGe layers 102 and 132.

Referring to FIG. 3B, Si is epitaxially grown from Si layer 104 and semiconductor layer 134 in the manner described in relation to FIG. 1J, thereby joining Si layer 104 and semiconductor layer 134 with a region "C".

Referring to FIG. 3C, a transistor is formed in the manner described in relation to FIGS. 1K through 1M.

According to selected embodiments of the present invention, spaces 340 are extended to completely overlap the channel region and to partially overlap source and drain regions 158. In other words, spaces 340 formed in the active region below gate electrode 114 are extended cover only a portion of the active region. A portion of second SiGe layer 132 adjacent to second insulating spacers 122 still remains between semiconductor substrate 100 and semiconductor layer 134. Accordingly, the length of spaces 340 is limited by the portion of second SiGe layer 132 remaining between semiconductor substrate 100 and source and drain regions 158. Due to second SiGe layer 132, a substrate floating effect is prevented from occurring in a MOS transistor.

Figure 4A:
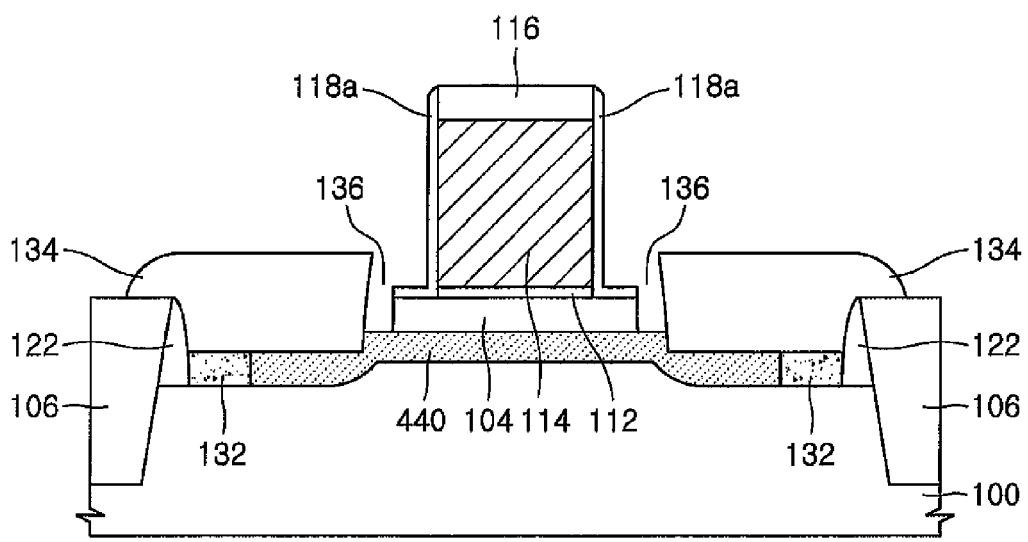
FIGS. 4A through 4C are cross-sectional views illustrating a method of manufacturing a semiconductor device according to still another embodiment of the present invention.
Figure 4B:
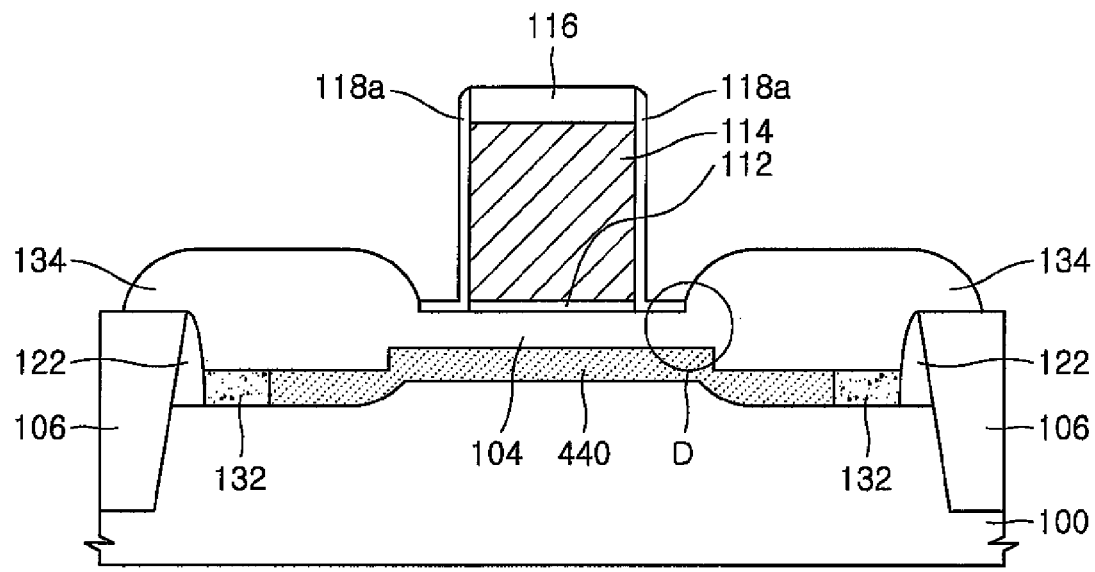
Figure 4C:
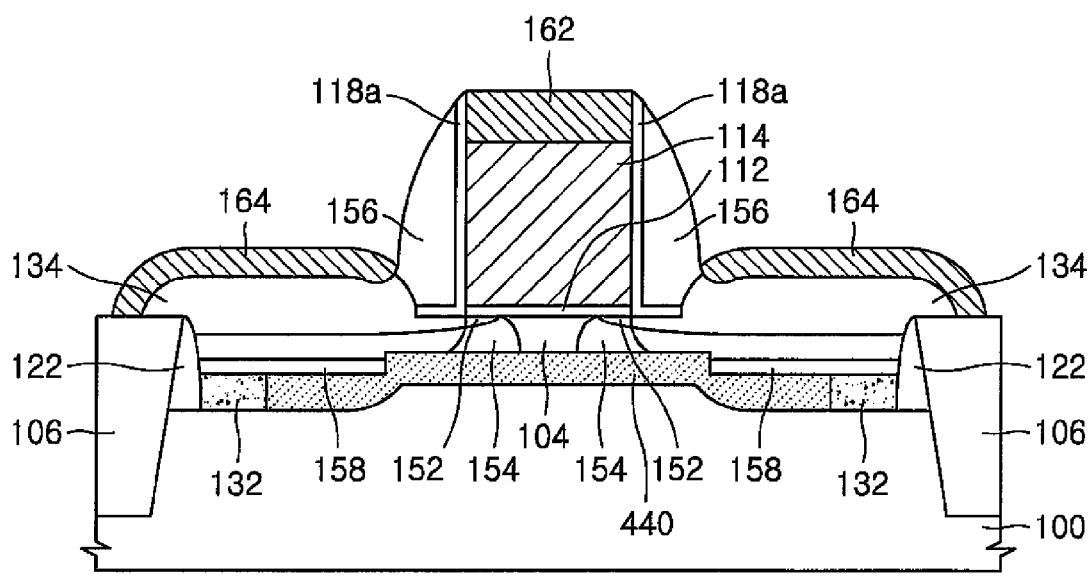

FIGS. 4A through 4C are cross-sectional views illustrating a method of manufacturing a semiconductor device according to still another embodiment of the present invention.

The method illustrated in FIG. 4A is substantially similar to the method illustrated in FIGS. 3A through 3C. However, one difference is that spaces 340 formed in the active region below gate electrode 114 are filled with an insulating material.

Referring to FIG. 4A, an insulating material is deposited to fill spaces 340 shown in FIG. 3A and an etch-back process is performed until sidewalls of Si layer 104 are exposed, thereby forming an insulating layer 440. Insulating layer 440 typically comprises an oxide layer or a nitride layer.

Referring to FIG. 4B, Si is epitaxially grown from Si layer 104 and semiconductor layer 134 in the manner described in relation to FIG. 1J, thereby joining Si layer 104 and semiconductor layer 134 with a region "D".

Referring to FIG. 4C, a transistor is formed in the manner described in relation to FIGS. 1K through 1M.

FIGS. 5A through 5E are cross-sectional views illustrating a method of manufacturing a semiconductor device according to still another embodiment of the present invention.

The method illustrated in FIGS. 5A through 5E is substantially similar to the method illustrated in FIGS. 1A through 1M. One difference, however, is that spaces are only formed below the channel region but not in other parts of the active region.

Figure 5A:
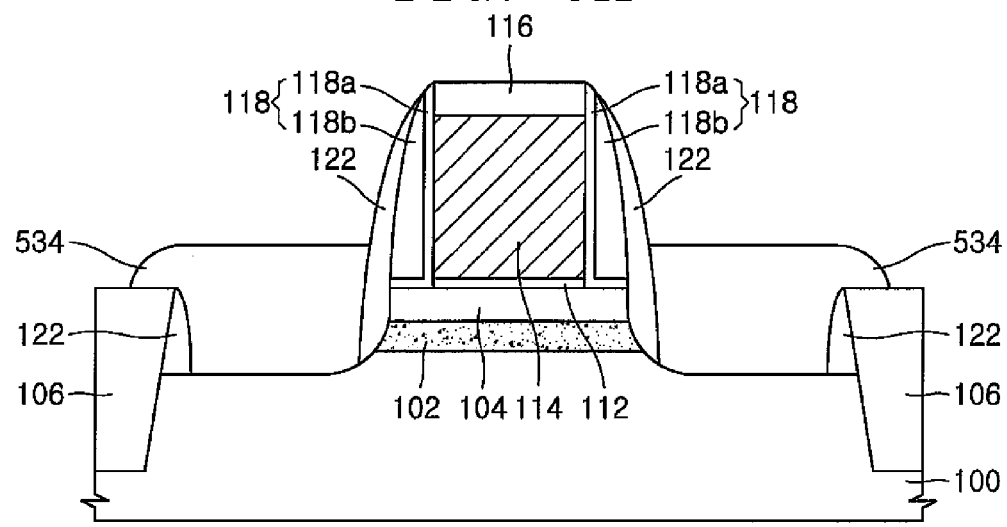
FIGS. 5A through 5E are cross-sectional views illustrating a method of manufacturing a semiconductor device according to still another embodiment of the present invention; and, FIGS. 6A through 6C are cross-sectional views illustrating a method of manufacturing a semiconductor device according to a sixth embodiment of the present invention.

Referring to FIG. 5A, second insulating spacers 122 are formed in the manner described in relation to FIGS. 1A through 1E. A semiconductor layer 534 is then formed on semiconductor substrate 100 in recess region 120. Typically, semiconductor layer 534 is formed of materials whose composition is different from that of first SiGe layer 102. For example, semiconductor layer 534 is typically formed of Si, SiC or SiGe. Where semiconductor layer 534 is formed of SiC, the carrier mobility in a NMOS device is readily improved by locally applying a tensile stress to the channel region formed by Si layer 104. Where semiconductor layer 534 is formed of SiGe, the carrier mobility in a positive metal-oxide semiconductor (PMOS) device is readily improved by locally applying a tensile stress to the channel region formed by Si layer 104. Where semiconductor layer 534 is formed of SiGe, it preferably has a Ge concentration lower than the Ge concentration of first SiGe layer 102.

Semiconductor layer 534 is formed to a thickness sufficient to fill recess region 120. As shown in FIG. 5A, semiconductor layer 534 typically has a thickness such that it partially covers an upper surface of device isolation region 106, thereby protecting a corner portion of device isolation region 106.

Figure 5B:
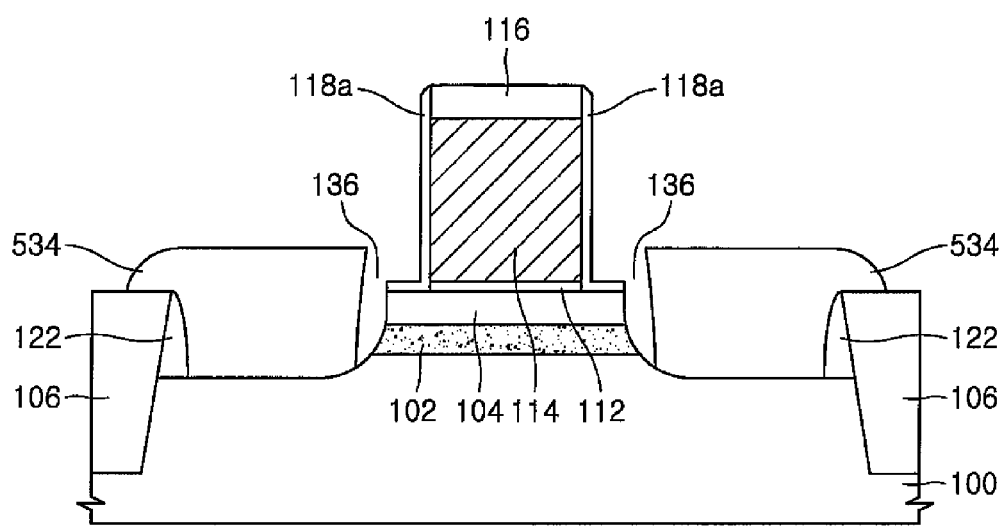

Referring to FIG. 5B, second insulating spacers 122 and silicon oxide layer 118*b* are selectively etched and removed in the manner described in relation to FIG. 1H. Consequently, spaces 136 are formed between Si layer 104 and semiconductor layer 534. Sidewalls of first SiGe layer 102 are exposed through spaces 136.

Figure 5C:
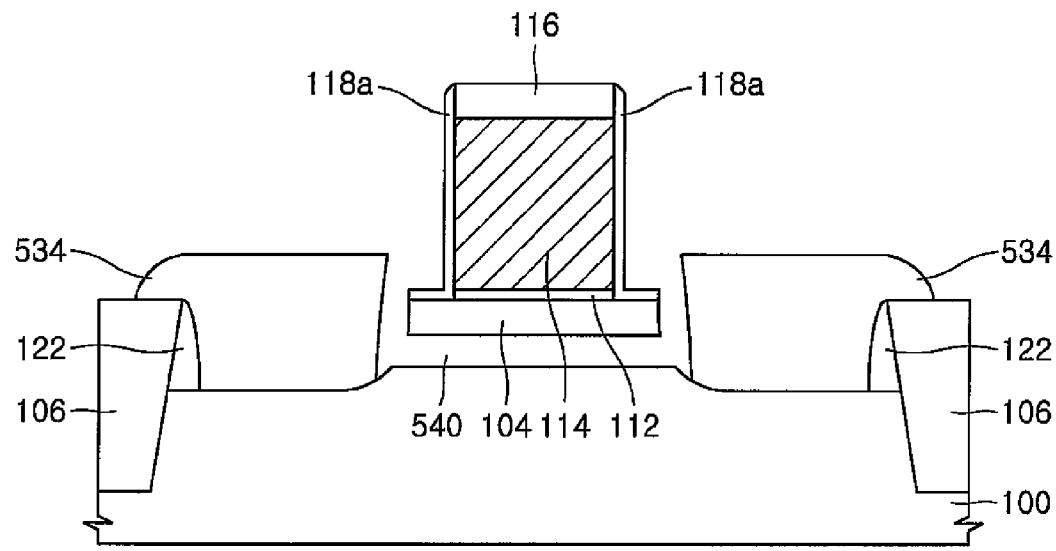

Referring to FIG. 5C, first SiGe layer 102 is selectively removed to form spaces 540 below Si layer 104 in the manner described in relation to FIG. 1I. Where semiconductor layer 534 is formed of SiGe, the Ge concentration of first SiGe layer 102 is typically higher than that of semiconductor layer 534, as described in relation to FIG. 5A. Accordingly, even where semiconductor layer 534 is formed of SiGe, first SiGe layer 102 can be selectively removed under the condition that it has a high etch selectivity relative to semiconductor layer 534.

Figure 5D:
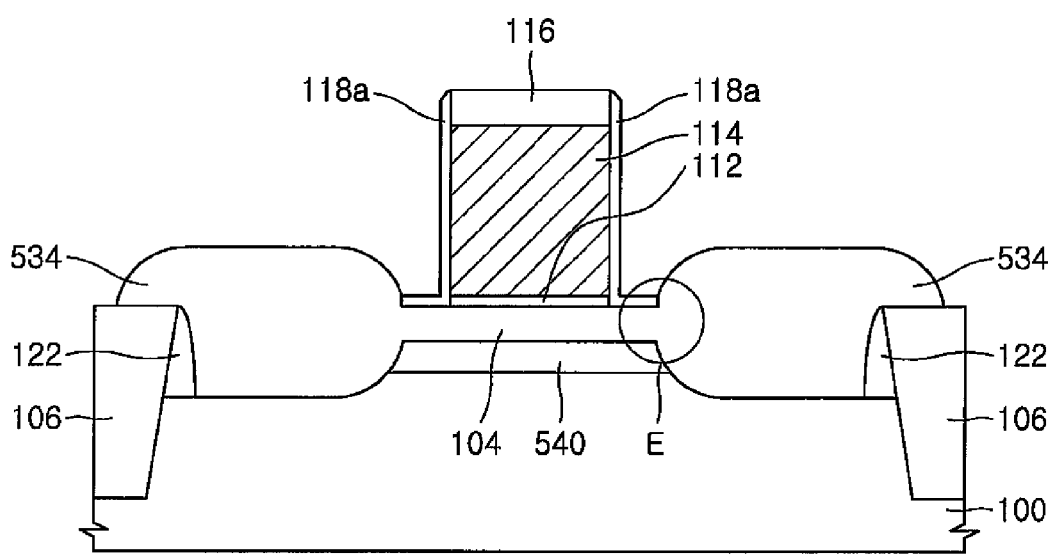

Referring to FIG. 5D, Si is epitaxially grown from Si layer 104 and semiconductor layer 534 in the same manner described in relation to FIG. 1J, thereby joining Si layer 104 and semiconductor layer 534 with a region "E". Consequently, spaces 540 remain only below the channel region formed by Si layer 104 in the active region.

Figure 5E:
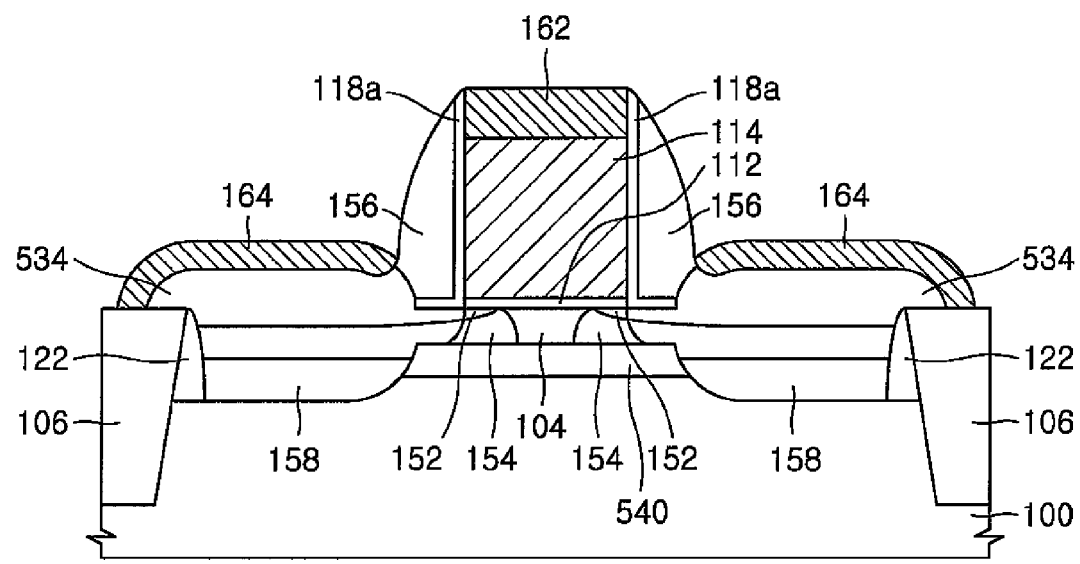

Referring to FIG. 5E, extension region 152 and halo ion implantation region 154 are formed in semiconductor layer 534 and Si layer 104 below gate electrode 114 in the manner described in relation to FIGS. 1K through 1M. Third insulating spacers 156 and source and drain regions 158 are then formed. Where necessary, metal silicide layers 162 and 164 are formed on gate electrode 114 and source and drain regions 158. In this manner, the formation of a transistor is completed.

Figure 6A:
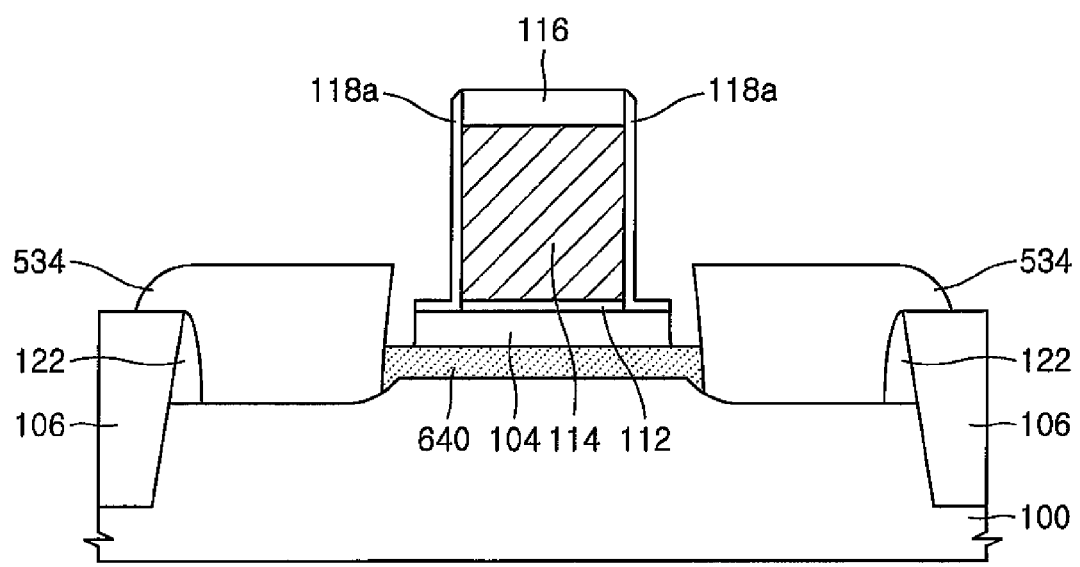
Figure 6B:
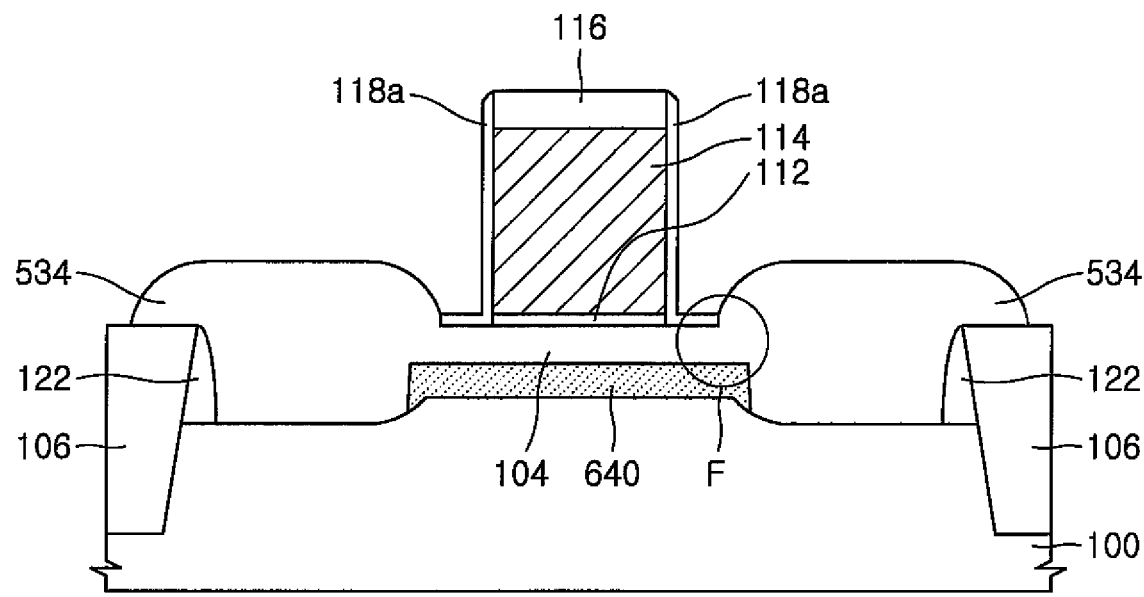
Figure 6C:
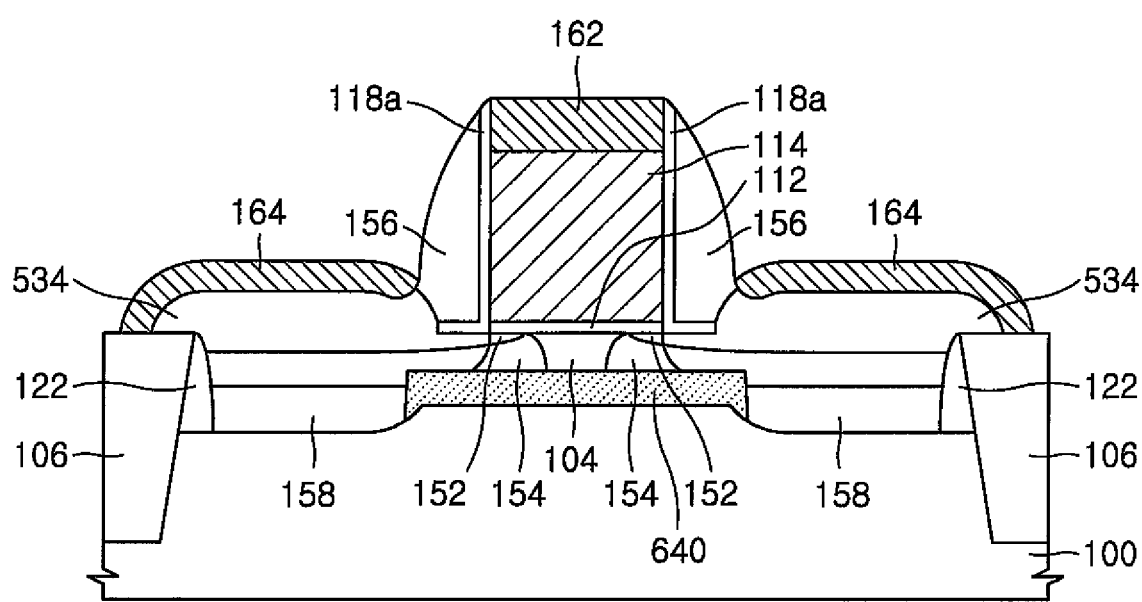

FIGS. 6A through 6C are cross-sectional views illustrating a method of manufacturing a semiconductor device according to still another embodiment of the present invention.

The method illustrated in FIGS. 6A through 6C is substantially similar to the method illustrated in FIGS. 5A through 5E. One difference, however, is that spaces 540 formed below the channel region formed by Si layer 104 are filled with an insulating material.

Referring to FIG. 6A, spaces 540 are formed below Si layer 104 in the manner described in relation to FIGS. 5A through 5C. An insulating material is deposited on semiconductor substrate 100 to fill spaces 540 and an etch-back process is performed until the sidewalls of Si layer 104 are exposed. Consequently, spaces 540 are filled with an insulating layer 640. Insulating layer 640 is typically formed of an oxide layer or a nitride layer.

Referring to FIG. 6B, Si is epitaxially grown from Si layer 104 and semiconductor layer 534 in the manner described in relation to FIG. 5D, thereby joining Si layer 104 and semiconductor layer 534 with a region "F".

Referring to FIG. 6C, a transistor is formed in the manner described in relation to FIG. 5E.

According to the present invention, the short channel effect is constrained and junction resistance is reduced by forming spaces in the active region below the gate electrode of a MOS transistor. In addition, the present invention avoids the problem of the substrate floating effect that occurs in the SOI substrate. Further, it is possible to implement the technique whereby local stress is applied to the channel region. Accordingly, where the present invention is applied to the manufacture of very large scale integrated semiconductor devices, the performance of the device is improved by employing a structure which increases carrier mobility. In addition, the highly-integrated semiconductor devices can be manufactured at a low cost relative to those using SOI technology.

The exemplary embodiments of the present invention described herein are teaching examples. Those of ordinary skill will understand that various changes in form and details may be made thereto without departing from the scope of the present invention as defined by the following claims.

What is claimed:

1. A method of manufacturing a semiconductor device, comprising:
   forming a first silicon germanium (SiGe) layer formed on a bulk semiconductor substrate;
   forming a silicon (Si) layer on the first SiGe layer;
   defining an active region on the semiconductor substrate;
   sequentially forming a gate insulating layer and a gate electrode on the Si layer;
   selectively removing portions of the Si layer and the first SiGe layer to form a recess region exposing the semiconductor substrate, the recess region being formed in the active region near the gate electrode;
   forming a semiconductor layer within the recess region;
   selectively removing the first SiGe layer to form spaces below the Si layer in the active region;
   epitaxially growing Si, such that the Si layer and the semiconductor layer are joined; and,
   forming source and drain regions in the semiconductor layer.

2. The method of claim 1, wherein the semiconductor layer comprises:
   a first semiconductor layer formed from a second SiGe layer, and a second semiconductor layer formed from a Si layer or a SiC layer.

3. The method of claim 2, wherein Ge concentration in the second SiGe layer is substantially equal to Ge concentration in the first SiGe layer.

4. The method of claim 2, wherein the first semiconductor layer is selectively and simultaneously removed with the selective removal of the first SiGe layer; and
   wherein the spaces extended from a lower portion of the Si layer to a lower portion of the second semiconductor layer.

5. The method of claim 4, wherein the first semiconductor layer is completely and simultaneously removed.

6. The method of claim 4, wherein the first semiconductor layer is partially simultaneously removed.

7. The method of claim 1, wherein the semiconductor layer is formed from a single layer comprising a Si layer, a SiC layer, or a SiGe layer.

8. The method of claim 7, wherein the semiconductor layer is not removed with the first SiGe layer.

9. The method of claim 7, wherein the semiconductor layer is formed from a SiGe layer having a concentration of Ge which is lower than a concentration of Ge in the first SiGe layer.

10. The method of claim 1, wherein the spaces are formed only below the Si layer.

11. The method of claim 1, further comprising:
    forming an insulating layer to fill the spaces.

12. The method of claim 11, wherein the insulating layer is formed from an oxide layer or a nitride layer.

* * * * *